(12) United States Patent
Schmid et al.

(10) Patent No.: US 8,270,451 B2
(45) Date of Patent: Sep. 18, 2012

(54) EDGE EMITTING SEMICONDUCTOR LASER HAVING A PHASE STRUCTURE

(75) Inventors: Wolfgang Schmid, Regensburg (DE);
Uwe D. Zeitner, Weimar (DE);
Hans-Christoph Eckstein, Jena (DE)

(73) Assignees: OSRAM Opto Semiconductors GmbH, Regensburg (DE);
Fraunhofer-Gesellschaft zur Foerderung der Angewandten Forschung E. V., Munich (DE)

(*) Notice: Subject to any disclaimer, the term of this patent is extended or adjusted under 35 U.S.C. 154(b) by 0 days.

(21) Appl. No.: 12/956,558

(22) Filed: Nov. 30, 2010

(65) Prior Publication Data
US 2011/0122907 A1 May 26, 2011

Related U.S. Application Data

(63) Continuation of application No. PCT/DE2009/000716, filed on May 20, 2009.

(30) Foreign Application Priority Data

May 30, 2008 (DE) .................. 10 2008 025 922

(51) Int. Cl.
*H01S 3/08* (2006.01)
(52) U.S. Cl. ..... 372/108; 372/92; 372/45.01; 372/43.01
(58) Field of Classification Search .......... 372/108, 372/92, 45.01, 43.01
See application file for complete search history.

(56) References Cited

U.S. PATENT DOCUMENTS

| 4,282,494 | A | 8/1981 | Yonezu et al. |
| 4,875,216 | A | 10/1989 | Thornton et al. |
| 6,148,013 | A | 11/2000 | Geels et al. |
| 6,291,256 | B1 | 9/2001 | Chen et al. |
| 6,414,976 | B1 | 7/2002 | Hirata |

(Continued)

FOREIGN PATENT DOCUMENTS

DE 196 36 229 A1 3/1998

(Continued)

OTHER PUBLICATIONS

Herzig, H.P., "Micro-optics; Elements, Systems and Applications," CRC Press, Apr. 26, 1997, 41 pages.

(Continued)

*Primary Examiner* — Kinam Park
(74) *Attorney, Agent, or Firm* — Slater & Matsil, L.L.P.

(57) ABSTRACT

An edge emitting semiconductor laser includes a semiconductor body, which has a waveguide region. The waveguide region has an active layer for generating laser radiation. The active layer is arranged between a first waveguide layer and a second waveguide layer. The waveguide region is arranged between a first cladding layer and a second cladding layer. The semiconductor body has a main region and at least one phase structure region in which is formed a phase structure for the selection of lateral modes of the laser radiation emitted by the active layer. The phase structure region is arranged outside the waveguide region or formed by a region in which a dopant is introduced or an intermixing structure is produced.

35 Claims, 9 Drawing Sheets

U.S. PATENT DOCUMENTS

| | | |
|---|---|---|
| 6,920,160 B2 | 7/2005 | Zeitner et al. |
| 7,037,739 B2 * | 5/2006 | Byun et al. ............... 438/31 |
| 7,526,007 B2 | 4/2009 | Chua et al. |
| 2002/0097762 A1 | 7/2002 | Marsh et al. |
| 2003/0147445 A1 * | 8/2003 | Zeitner et al. ............ 372/92 |
| 2007/0153853 A1 | 7/2007 | Chua et al. |
| 2008/0089374 A1 | 4/2008 | Eichler et al. |

FOREIGN PATENT DOCUMENTS

| | | |
|---|---|---|
| DE | 10 2004 040 518 A1 | 5/2005 |
| DE | 10 2006 046 297 A1 | 4/2008 |
| DE | 10 2008 025 922 A1 | 12/2009 |
| JP | 2002-329926 A | 11/2002 |
| JP | 2005-183821 A | 7/2005 |
| JP | 2007-157906 A | 6/2007 |
| WO | WO 01/97349 A1 | 12/2001 |

OTHER PUBLICATIONS

Schmid, W., "Highly Efficient Light-emitting Diodes with a Lateral Decoupling Taper: Concept, Production and Properties," Dissertation, Faculty for Engineering of the University of Ulm, Department of Optoelectronics, 2001, ISBN 978-3-18-334709-4, 9 pages.

* cited by examiner

EDGE EMITTING SEMICONDUCTOR LASER HAVING A PHASE STRUCTURE

This application is a continuation of co-pending International Application No. PCT/DE2009/000716, filed May 20, 2009, which designated the United States and was not published in English, and which claims priority to German Application No. 10 2008 025 922.5, filed May 30, 2008, both of which applications are incorporated herein by reference.

TECHNICAL FIELD

The invention relates to an edge emitting semiconductor laser having a phase structure region.

BACKGROUND

Edge emitting semiconductor lasers for high output powers are usually embodied as broad stripe laser, in which the active region has a width of approximately 100 µm or more. Owing to the comparatively large lateral extent of the active region, generally a large number of lateral laser modes can establish oscillation in the case of semiconductor lasers of this type. In the case of high light powers, in particular, an undesired high degree of modulation of the light power can occur, which is also referred to as filamenting. In the case of edge emitting semiconductor lasers, the maximum output power density is limited by melting of the semiconductor body in the region of the side facets, which is also referred to as COMD (catastrophic optical mirror damage). As a result, the maximum possible output power is reduced in the case of a semiconductor laser having a high degree of filamenting. Furthermore, multimode operation of an edge emitting semiconductor laser makes it more difficult to couple the emitted laser light into downstream optical elements, in particular, into optical waveguides.

In order to suppress higher lateral laser modes, in particular, in order to obtain operation in the lateral fundamental mode, the document WO 01/97349 A1 discloses forming phase structures in the waveguide of an edge emitting semiconductor laser. The phase structures are regions of the semiconductor body in which the effective refractive index deviates from the effective refractive index of the regions of the semiconductor body that adjoin in a lateral direction and which are formed such that higher laser modes incur greater circulation losses in the laser resonator than the lateral fundamental mode of the semiconductor laser. In the case of an edge emitting semiconductor laser in which the active layer is arranged between two waveguide layers and the waveguide layers are arranged between two cladding layers, the phase structure is produced, for example, by the waveguide being thinned right into the region of a waveguide layer. What is achieved in this way, for example, is that the effective refractive index for the laser radiation propagating in a lateral direction is smaller by $\Delta n = 0.03$ in the thinned region than in the non-thinned region.

SUMMARY

It has been found that, as a result of the formation of phase structure regions, although higher lateral modes can be suppressed in the edge emitting semiconductor laser, on the other hand the jump in refractive index between the phase structure region and the adjoining regions leads to coupling losses that impair the efficiency of the semiconductor laser. The light-current characteristic curve, in particular, is adversely influenced by such coupling losses.

In one aspect, the present invention specifies an edge emitting semiconductor laser comprising a waveguide in which at least one phase structure region is formed which is distinguished by an improved efficiency.

In accordance with at least one embodiment of the invention, an edge emitting semiconductor laser contains a semiconductor body having a waveguide region, wherein the waveguide region has a first waveguide layer, a second waveguide layer and an active layer for generating laser radiation, the active layer being arranged between the first waveguide layer and the second waveguide layer. The waveguide region is arranged between a first cladding layer and a second cladding layer, which is disposed downstream of the waveguide region in the growth direction of the semiconductor body. The semiconductor body has a main region and at least one phase structure region which is adjacent to the main region in a lateral direction and in which is formed a phase structure for the selection of lateral modes of the laser radiation emitted by the active layer.

In one advantageous embodiment, the phase structure region is formed outside the waveguide region. In this case, the first waveguide layer, the second waveguide layer and the active layer in each case contain no phase structures. The waveguide region between the first cladding layer and the second cladding layer is therefore advantageously free of phase structures. What is achieved in this way is that only very small coupling losses occur between the phase structure region and the main region of the semiconductor body, as a result of which the efficiency of the semiconductor laser, in particular, the light-current characteristic curve, is improved.

The phase structure region is preferably formed in the second cladding layer of the semiconductor body. By way of example, the edge emitting semiconductor laser has a substrate followed by, in the growth direction of the semiconductor layer sequence, firstly the first cladding layer, then the first waveguide layer, thereon the active layer for generating laser radiation, subsequently the second waveguide layer and thereon the second cladding layer. In this case, the phase structure region is formed only in the second cladding layer lying opposite the substrate, while the first cladding layer, the active layer and the waveguide layers in each case have no phase structure region. Since the laser radiation propagating in a lateral direction in the semiconductor body substantially propagates in the active layer and also in the first waveguide layer and the second waveguide layer and penetrates only slightly into the first and second cladding layers, the vertical mode distribution in the semiconductor body is influenced only slightly by the phase structure produced in the second cladding layer. This is advantageous for the efficiency of the semiconductor laser; in particular, it is thereby possible to obtain an improvement in the light-current characteristic curve in comparison with semiconductor lasers in which the phase structure region is formed in at least one of the waveguide layers.

The phase structure in the semiconductor body can be produced, for example, by the second cladding layer being at least partly removed in the phase structure region. The second cladding layer therefore preferably has a smaller thickness in the phase structure region than in the main region adjacent in a lateral direction.

In this case, it is advantageous if a transition region is formed between the phase structure region and the main region. In this transition region, the thickness of the second cladding layer varies step by step or continuously, in order to avoid an abrupt change in the refractive index between the phase structure region and the main region of the semiconductor body. Coupling losses can be reduced in this way. By way of example, the second cladding layer can have a thickness $d_1$ in the phase structure region and a thickness $d_2>d_1$ in the main region, wherein the thickness of the second cladding layer in a transition region rises continuously, preferably linearly, from the thickness $d_1$ to the thickness $d_2$. Alternatively, however, the thickness in the transition region can also rise in a stepped fashion in a plurality of steps from $d_1$ to $d_2$.

The production of the phase structure by at least partial removal of the second cladding layer in the phase structure region can be effected by means of an etching process, in particular. In this case, it is advantageous if the second cladding layer is provided with a passivation layer in the region in which it is at least partly removed. The passivation layer can contain or consist of, for example, a silicon oxide, a silicon nitride or a silicon oxynitride.

In a further advantageous embodiment, the effective refractive index is changed in the phase structure region by comparison with the main region adjacent in a lateral direction, as a result of the introduction of a dopant. In particular, a dopant can be indiffused or implanted into the phase structure region of the semiconductor body.

The introduction of the additional dopant can be effected into the second cladding layer, for example, such that the phase structure region is formed outside the waveguide region. In this embodiment, however, the phase structure region need not necessarily be formed outside the waveguide region. Rather, it can be advantageous if the introduction of the additional dopant is effected not only into the second cladding layer but also into the underlying layers, that is to say, in particular, the first cladding layer, the first and second waveguide layers and also the active layer. This has the advantage that the vertical mode distribution is influenced only insignificantly by the change in the refractive index effected by the introduction of the dopant, because all of the layers in which the laser radiation propagates have the jump in refractive index between the phase structure region and the main region.

In a further advantageous embodiment, the semiconductor body has an intermixing structure in the phase structure region. For this purpose, preferably one or a plurality of layers of the semiconductor body, that is to say the first and/or second cladding layer, the active layer, the first and/or second waveguide layer, are in each case embodied as a multilayer, wherein the multilayer has in each case a plurality of partial layers that differ from one another in terms of their material composition. In order to produce the phase structure region, the one or the plurality of multilayers are intermixed in the semiconductor body in order to bring about a change in the refractive index in this region.

By way of example, the second cladding layer can be embodied as a multilayer and subsequently be intermixed, such that the phase structure region is formed outside the waveguide region.

In this embodiment, however, the phase structure region does not have to be formed outside the waveguide region, rather it is also possible for one or a plurality of the underlying layers, that is to say, in particular, the first cladding layer, the first and second waveguide layers, and also the active layer, to be intermixed.

The intermixing of the one or the plurality of multilayers in the phase structure region can be effected, for example, by means of the diffusion-induced intermixing known per se, in which Zn or Si, for example, are indiffused or implanted into the multilayer structure and a thermal treatment is subsequently performed. In a further variant crystal defects are produced in the topmost semiconductor layer. The defects propagate into the underlying semiconductor layers during a subsequent thermal treatment.

The effective refractive index $n_{P,\mathit{eff}}$ of the phase structure region preferably deviates by not more than $1*10^{-2}$ from the effective refractive index $n_{H,\mathit{eff}}$ of a main region of the semiconductor body that is adjacent to the phase structure region in a lateral direction.

The following therefore advantageously holds true: $|n_{H,\mathit{eff}}-n_{P,\mathit{eff}}|\leq 0.01$.

It has been found that such a small jump in the refractive index between the phase structure region and the main region of the semiconductor body that is adjacent in a lateral direction is already suitable for suppressing higher lateral laser modes. At the same time, only small coupling losses occur in the case of such a small jump in refractive index. Furthermore, the vertical mode distribution is influenced only slightly on account of the small difference in refractive index between the phase structure region and the adjacent main region.

Preferably, the effective refractive index $n_{P,\mathit{eff}}$ of the phase structure region deviates by at least $1*10^{-3}$ from the effective refractive index $n_{H,\mathit{eff}}$ of the main region of the semiconductor body. This advantageous lower limit for the difference in the effective refractive index between the phase structure region and the adjacent main region of the semiconductor body results from the fact that the jump in refractive index should be greater than unintended refractive index fluctuations which could occur as a result of unintended deviations of the temperature and/or of the charge carrier density within the semiconductor body.

The following therefore preferably holds true: $0.001\leq |n_{H,\mathit{eff}}-n_{P,\mathit{eff}}|\leq 0.01$.

This choice of the effective refractive indices is advantageous, in particular, for the embodiment in which the phase structure is produced by removal of at least one part of the second cladding layer. In the embodiment in which the phase structure is produced by doping or an intermixing process, alternatively however, it is also possible to choose a larger difference in the effective refractive indices since, in this case, the vertical mode distribution is influenced only slightly by the difference in refractive index between the main region and the phase structure region.

In one advantageous configuration, the phase structure region adjoins at least one side facet of the semiconductor laser. In particular, a first phase structure region can adjoin a first side facet of the semiconductor laser and a second phase structure region can adjoin a second side facet of the semiconductor laser. By virtue of the fact that a phase structure region adjoins a side facet of the semiconductor laser, the laser light propagating in a direction of the side facet couples into the phase structure region only once and couples out from the phase structure region again once during return after reflection at the side facet. In contrast thereto, in the case of a phase structure region which does not extend as far as the side facet of the semiconductor laser, the laser radiation would firstly couple into the phase structure region and couple out again and, after reflection at the side facet, would once again couple into the phase structure region and then couple out from the phase structure region again.

By virtue of the phase structure region adjoining the side facet of the semiconductor laser, therefore, the number of coupling-over processes between the phase structure region and the main region at the respective side facet is reduced by two. If a respective phase structure region adjoins the side facet on both sides of the semiconductor laser, the number of coupling-over processes during a complete circulation of the laser radiation in the laser resonator formed by the side facets, that is to say outgoing and return passage, decreases from eight to four coupling-over processes. The coupling losses in the semiconductor body are reduced in this way, as a result of which the efficiency of the semiconductor laser is improved.

A further advantageous reduction of the coupling losses that occur when the laser radiation crosses from the phase structure region into the adjacent main region of the semiconductor body, and vice versa, can be obtained by a transition region being formed between the phase structure region and the main region, in which transition region the effective refractive index varies in a plurality of steps or continuously. In this case, therefore, the phase structure region does not directly adjoin the adjacent main region, but rather is separated from the latter by a transition region. What is achieved in this way is that the refractive index does not change abruptly between the phase structure region and the adjacent main region, but rather continuously or in a plurality of substeps that are in each case smaller than the difference in refractive index between the main region and the phase structure region.

In the case of a continuous transition in the refractive index between the phase structure region and the main region, it is advantageous if the gradient, that is to say the change $\Delta n_{\mathit{eff}}$ in the effective refractive index per unit length, is not more than $0.01\ \mu m^{-1}$.

BRIEF DESCRIPTION OF THE DRAWINGS

The invention is explained in greater detail below on the basis of exemplary embodiments in association with FIGS. 1 to 6.

Identical or identically acting constituent parts are provided with the same reference symbols in the figures. The illustrated constituent parts and also the size relationships of the constituent parts among one another should not be regarded as true to scale.

DETAILED DESCRIPTION OF ILLUSTRATIVE EMBODIMENTS

Figure 1A:
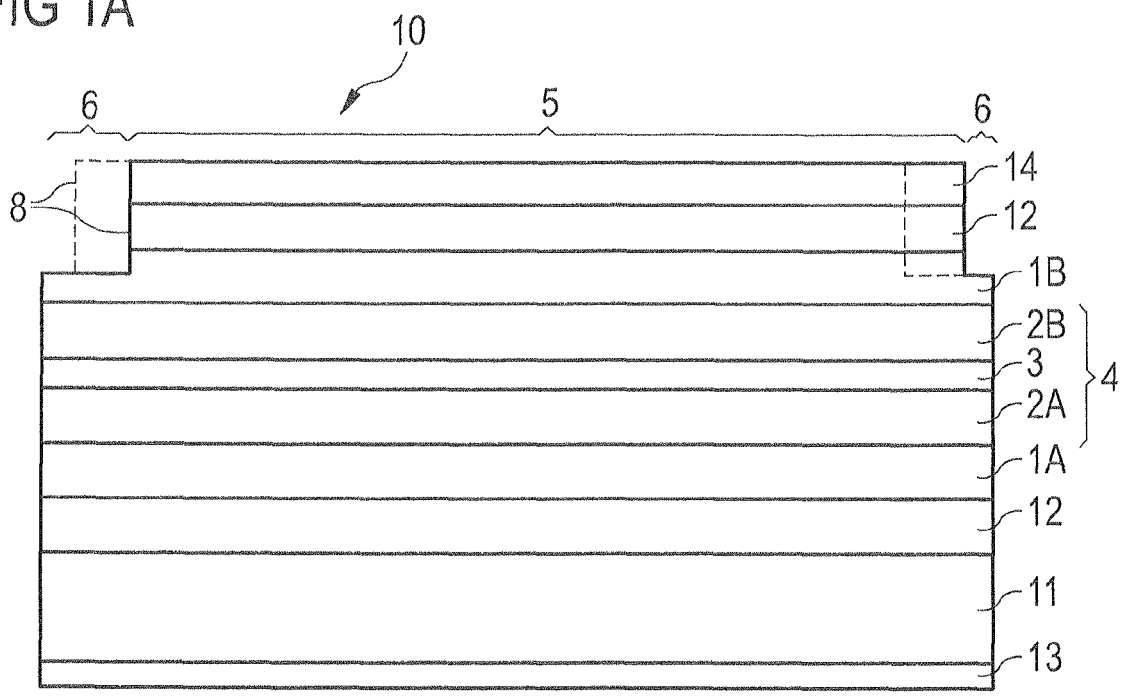
FIG. 1A shows a schematic illustration of a cross section through an exemplary embodiment of an edge emitting semiconductor laser.
Figure 1B:
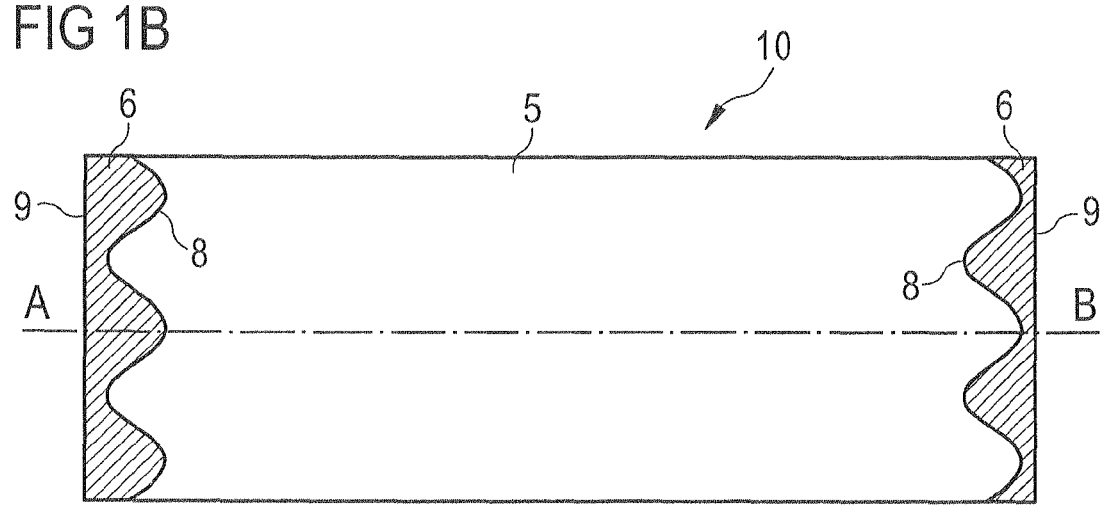
FIG. 1B shows a schematic illustration of a plan view of the exemplary embodiment illustrated in FIG. 1A.

FIGS. 1A and 1B illustrate a first exemplary embodiment of an edge emitting semiconductor laser. FIG. 1A shows a cross section along the line A-B of the plan view illustrated in FIG. 1B.

The edge emitting semiconductor laser has a semiconductor body 10, which contains a waveguide region 4. The waveguide region 4 comprises a first waveguide layer 2A, a second waveguide layer 2B and an active layer 3 serving for generating laser radiation, the active layer 3 being arranged between the first waveguide layer 2A and the second waveguide layer 2B.

The active layer 3 of the edge emitting semiconductor laser can be, in particular, a single or multiple quantum well structure. In the context of the application, the designation quantum well structure encompasses any structure in which charge carriers experience a quantization of their energy states as a result of confinement. In particular, the designation quantum well structure does not include any indication about the dimensionality of the quantization. It thus encompasses, inter alia, quantum wells, quantum wires and quantum dots and any combination of these structures.

The waveguide region 4 is arranged between a first cladding layer 1A and a second cladding layer 1B, which is disposed downstream of the waveguide region 4 in the growth direction of the semiconductor body 10. The first cladding layer 1A is therefore arranged on a side facing a substrate 11 of the semiconductor body 10, and the second cladding layer 1B is arranged on a side of the semiconductor body 10 that is remote from the active layer 3 as viewed from the substrate 11.

One or a plurality of intermediate layers 12 can be arranged between the substrate 11 of the semiconductor body 10 and the first cladding layer 1A. The electrical contact-connection of the edge emitting semiconductor laser is effected, for example, by means of a first electrical contact layer 13 at the rear side of the substrate 11, the rear side being remote from the active layer 3, and a second electrical contact layer 14 at a top side of the semiconductor body 10, the top side being remote from the substrate. One or a plurality of further intermediate layers 12 can be arranged between the second cladding layer 1B and the second electrical contact layer 14.

The cladding layers 1A, 1B advantageously have a smaller refractive index than the waveguide layers 2A, 2B, as a result of which the laser radiation propagating in a lateral direction is substantially confined in the waveguide region 4. Owing to the finite difference in refractive index between the waveguide layers 2A, 2B and the cladding layers 1A, 1B, however, the laser modes also propagate at least in part right into the cladding layers 1A, 1B. The propagation of the laser radiation in a lateral direction can therefore be described by an effective refractive index that is dependent on the refractive indices of the cladding layers 1A, 1B, of the waveguide layers 2A, 2B and of the active layer 3.

The semiconductor body 10 has phase structure regions 6 in each case in the regions adjoining the side facets 9 of the semiconductor laser, said phase structure regions serving for the selection of lateral modes of the laser radiation emitted by the active layer 3. In the phase structure regions 6, the effective refractive index $n_{P,\mathit{eff}}$ deviates from the effective refractive index $n_{H,\mathit{eff}}$ in the main region 5 of the semiconductor body 10 that is adjacent in a lateral direction.

The phase structure regions 6 are produced, for example, by the second cladding layer 1B being at least partly removed in the regions adjoining the side facets 9 of the semiconductor body 10. This can be effected, for example, by means of an etching process, wherein, for example, the intermediate layers 12 and the second contact layer 14 are also removed in these regions. The second cladding layer 1B is therefore thinner in the regions adjoining the side facets 9 than in the main region 5 or even completely removed. Since the laser modes, in the course of their propagation in a lateral direction in the semiconductor body 10, also at least partly extend right into the second cladding layer 1B, the thinning of the second cladding layer 1B in the phase structure regions 6 brings about a change in the effective refractive index in comparison with the main region 5.

The coupling losses between the phase structure regions 6 and the main region 5 are advantageously small since the phase structure regions 6 are not formed in the waveguide region 4, in which the laser radiation propagating in a lateral direction has the greatest intensity, but rather only in the second cladding layer 1B.

By means of the phase structure regions 6, it is possible to influence the propagation of the modes in a lateral direction in a targeted manner, wherein what can be achieved, in particular, is that higher lateral modes have greater circulation losses in the laser resonator arranged between the side facets 9 than the lateral fundamental mode of the semiconductor laser. By means of a suitable embodiment of the phase structures 6, therefore, monomode operation of the semiconductor laser can be achieved, in particular, in which only the lateral fundamental mode establishes oscillation. Furthermore, by means of the phase structures 6, it is also possible to shape the beam profile of the lateral fundamental mode. By way of example, the typical Gaussian beam profile of the fundamental mode can be approximated to a rectangular shape by means of suitable phase structures. An at least almost rectangular beam profile has the advantage over a Gaussian beam profile that melting in the region of the side facets (COMD-catastrophic optical mirror damage) would occur only at a higher output power.

The calculation of the three-dimensional structure of the phase structure regions 6 in such a way that a desired influencing of the lateral mode spectrum is achieved is known per se from the document WO 01/97349 A1, the disclosure content of which in this regard is hereby incorporated by reference. The width of the phase structure region 6 in which the second cladding layer 1B is at least partly removed is not constant in the plane of the second cladding layer 1 B, but rather follows a predetermined function which, with the inclusion of the parameters of the materials of the semiconductor layer sequence, of the geometrical dimensions and of the wavelength of the emitted radiation, is calculated in advance in such a way that higher lateral laser modes experience greater circulation losses in the laser resonator formed by the side facets 9 than lower lateral modes, in particular the lateral fundamental mode of the semiconductor laser. By way of example, the spacing between the respective side facets 9 of the semiconductor laser and the etching sidewalls 8 in the second cladding layer 1B, by means of which the phase structure regions 6 are produced, in the plane of the second cladding layer 1B, can assume an undulatory course, as is illustrated in the plan view in FIG. 1B.

The effective refractive index $n_{P,eff}$ of the phase structure regions 6 advantageously deviates by not more than $1*10^{-2}$ from the effective refractive index $n_{H,eff}$ of the main region 5 of the semiconductor body 10 that adjoins the phase structure regions 6 in a lateral direction. What is achieved in this way is that coupling losses that occur when the laser radiation crosses from the main region 5 into the phase structure regions 6, and vice versa, are reduced. The mode profile in a vertical direction, that is to say perpendicularly to the layer planes of the layers of the semiconductor body 10, is influenced only slightly on account of the small differences in the effective refractive index between the main region 5 and the phase structure regions 6. In contrast thereto, in the case of larger abrupt jumps in refractive index between a phase structure region 6 and the main region 5, undesired reflections would occur at the interfaces between these regions, as a result of which the efficiency of the semiconductor laser would be reduced.

Furthermore, it is advantageous if the difference in refractive index between the phase structure region 6 and the main region 5 is at least $1*10^{-3}$. What is achieved in this way is that the difference in refractive index between the main region 5 and the phase structure regions 6 dominates relative to undesired refractive index fluctuations within the semiconductor body 10 that can arise, for example, as a result of a variation of the temperature or of the charge carrier density within the semiconductor body 10. The difference in refractive index between the phase structure region 6 and the main region 5 therefore advantageously lies between $1*10^{-3}$ and $1*10^{-2}$ inclusive.

Furthermore, it is advantageous for the phase structure regions 6 to extend as far as the side facets 9 of the semiconductor laser. In the case of a complete circulation in the laser resonator formed by the side facets 9 of the semiconductor body 10, the laser radiation therefore couples in each case once into the two phase structure regions 6 and once out of the two phase structure regions 6. By contrast, if the phase structure regions 6 did not adjoin the side facets 9 of the semiconductor body 10, but rather were spaced apart from the side facets 9 such that a further part of the main region 5 would in each case be situated between the phase structure regions 6 and the side facets 9, the laser radiation would have to couple into each of the phase structures twice and couple out again twice, such that a total of eight coupling-over processes would take place during a complete circulation of the laser radiation in the laser resonator. The reduction of the coupling-over processes to a number of four that is achieved by means of the phase structure regions 6 adjoining the side facets 9 has the advantage that losses in the laser resonator are reduced and, as a result, the efficiency of the semiconductor laser is improved.

Figure 2A:
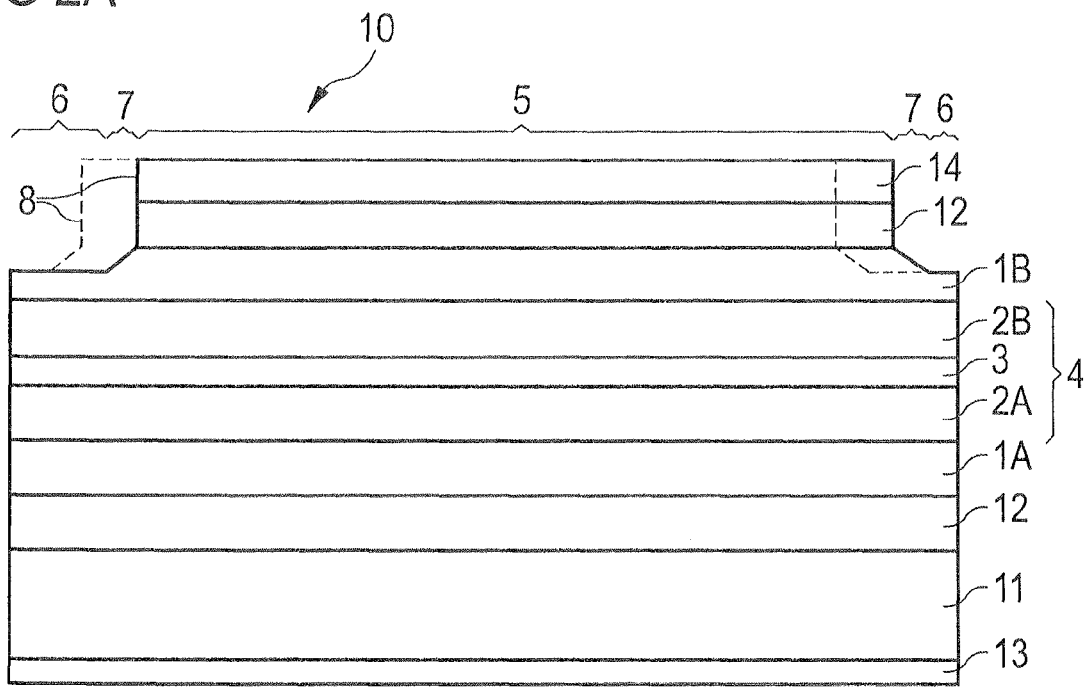
FIG. 2A shows a schematic illustration of a cross section through a further exemplary embodiment of an edge emitting semiconductor laser.
Figure 2B:
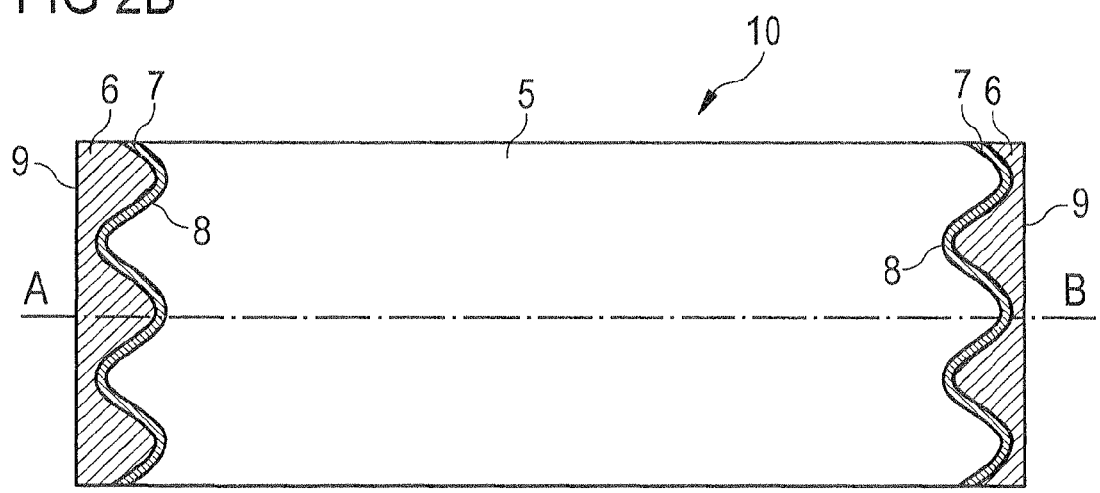
FIG. 2B shows a schematic illustration of a plan view of the exemplary embodiment illustrated in FIG. 2A.

FIGS. 2A and 2B illustrate a further exemplary embodiment of an edge emitting semiconductor laser. FIG. 2A shows a cross section along the line AB of the plan view illustrated in FIG. 2B.

The semiconductor body 10 has the same layer sequence as the first exemplary embodiment described above. As in the case of the exemplary embodiment described above, the semiconductor body 10 has a main region 5 and phase structure regions 6, wherein the effective refractive index in the phase structure regions 6 differs from the effective refractive index in the main region 5 because the second cladding layer 1B is partly removed in the phase structure regions 6.

The difference with respect to the exemplary embodiment described above is that the thickness of the second cladding layer 1B does not change abruptly between the phase structure regions 6 and the main region 5, rather a respective transition region 7 is situated between the main region 5 and the phase structure regions 6. In the transition region, the thickness of the first cladding layer 1B and hence the effective refractive index change continuously in a lateral direction.

As can be discerned in the cross section illustrated in FIG. 2A, the thickness of the second cladding layer 1B in the transition region 7 rises in each case linearly from the small thickness in the phase structure region 6 to the larger thickness in the main region 5.

In the case of this linear rise in the thickness of the second cladding layer 1B in the transition region 7, the gradient of the rise in the effective refractive index is preferably not more than $0.01\ \mu m^{-1}$.

What is achieved by the continuous or stepwise rise in the thickness of the second cladding layer 1B in the transition regions 7 in the second exemplary embodiment is that no abrupt jump in the refractive index takes place between the phase structure region 6 and the main region 5, as a result of which coupling losses between the main region 5 and the phase structure regions 6 are reduced further. In this case, the mode profile in a vertical direction is only slightly influenced by the phase structure regions 6, as a result of which losses are reduced in the laser resonator and, consequently, the efficiency of the semiconductor laser is improved further.

FIGS. 3A to 3E illustrate a first exemplary embodiment of a method for producing an edge emitting semiconductor laser on the basis of intermediate steps.

Figure 3A:
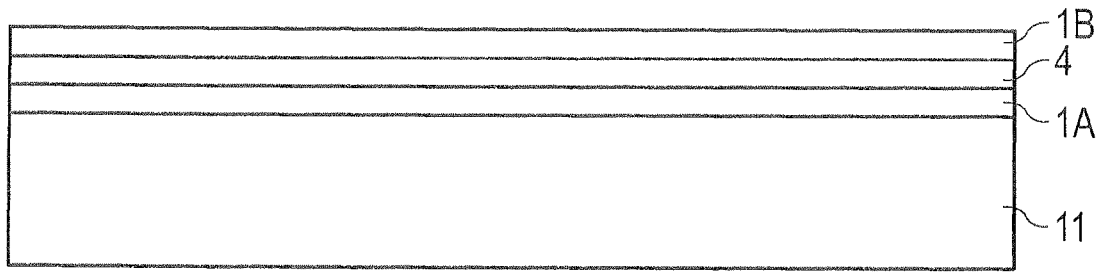
FIGS. 3A, 3B, 3C, 3D and 3E show a schematic illustration of an exemplary embodiment of a method for producing an edge emitting semiconductor laser on the basis of intermediate steps.

As illustrated in FIG. 3A, a first cladding layer 1A, the waveguide region 4 and a second cladding layer 1B are applied to a substrate 11. As in the exemplary embodiments described above, the waveguide region 4 contains an active layer enclosed between at least two waveguide layers. The individual layers of the waveguide region 4 are not illustrated individually, in order to simplify the illustration. Furthermore, optional intermediate layers can be arranged, for example, between the substrate 11 and the first cladding layer 1A, and are not illustrated, in order to simplify the illustration.

Figure 3B:
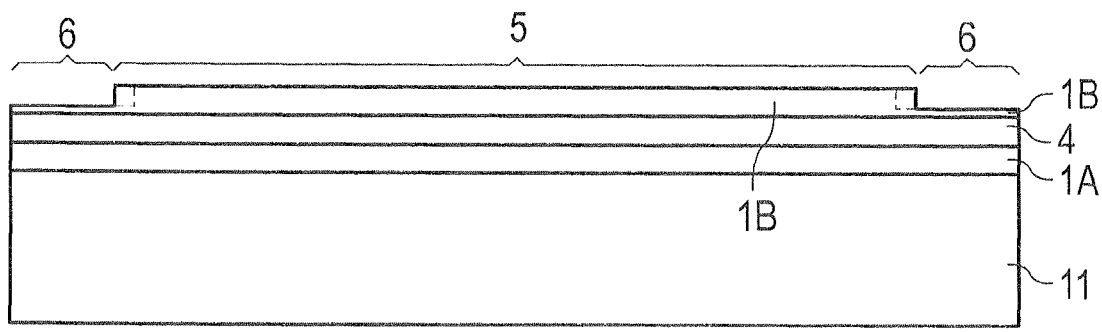

In the case of the intermediate step illustrated in FIG. 3B, phase structure regions 6 have in each case been produced in the second cladding layer 1B in regions adjoining the side facets of the semiconductor body. For this purpose, the second cladding layer 1B has been partly removed in the phase structure regions 6, for example, by means of an etching process.

Figure 3C:
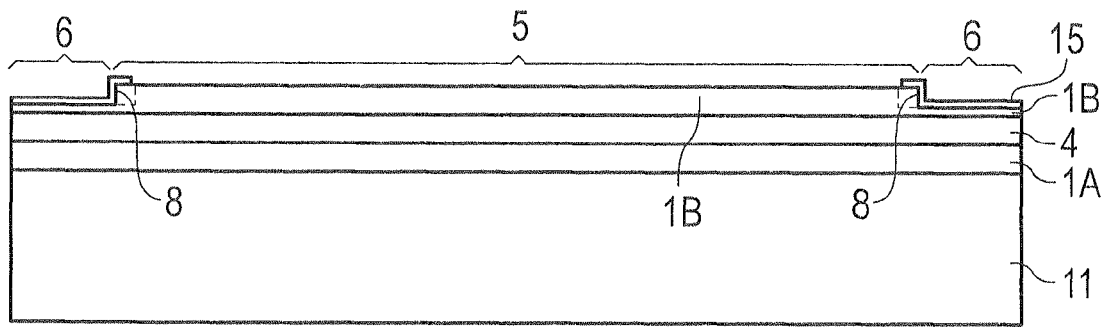

As is illustrated in FIG. 3C, in a subsequent method step, a passivation layer 15 is applied to the thinned region of the first cladding layer 1B, the etching sidewalls 8 and a partial region, adjoining the etching sidewalls 8, of the main region 5 of the first cladding layer 1B. The material of the passivation layer 15 can be, in particular, a silicon oxide, silicon nitride or a silicon oxynitride. The refractive index of the passivation layer 15 influences the effective refractive index in the phase structure regions 6. The refractive index of the passivation layer 15, which is approximately 2, for example, in the case of a silicon oxynitride, is therefore taken into account in the calculation of the phase structure.

Figure 3D:
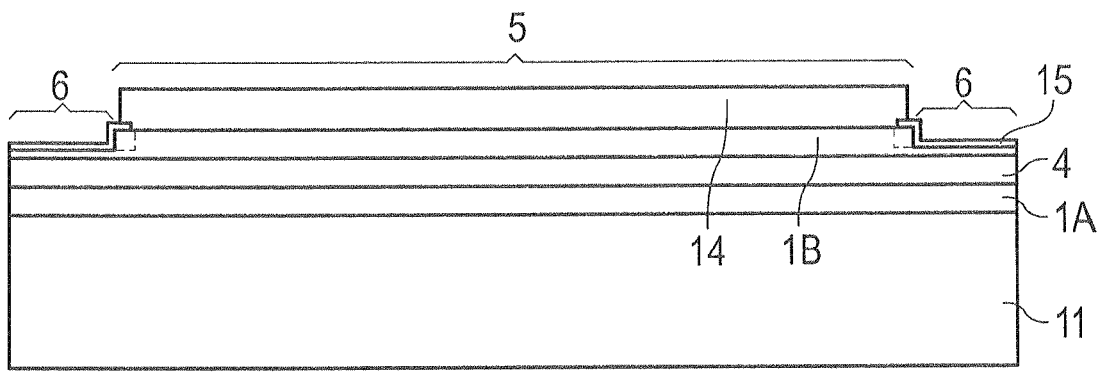

In the case of the intermediate step illustrated in FIG. 3D, a contact metallization 14 has been applied to the main region 5 of the second cladding layer 1B. The contact metallization 14 preferably contains one or a plurality of layers composed of a metal or a metal compound. In particular, the contact metallization 14 can be a layer sequence composed of a titanium layer, a platinum layer and a gold layer. Such a contact layer sequence 14 is suitable, in particular, for making electrical contact with a p-type semiconductor material from which the second cladding layer 1B, for example, is formed.

Figure 3E:
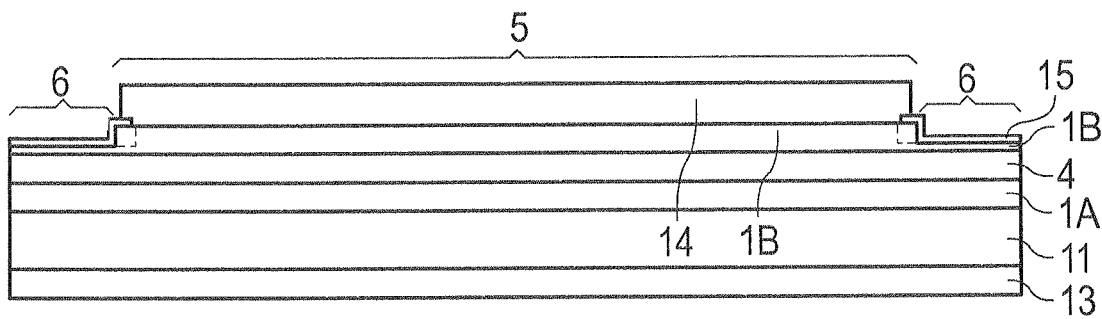

In the case of the method step illustrated in FIG. 3E, the substrate 11 has been thinned. This and the previously described method steps can be carried out in the wafer assemblage, wherein the wafer can subsequently be singulated into individual laser diode components. As a result of the thinning of the substrate 11, the wafer can be separated into individual components more easily. Furthermore, in the case of the method step illustrated in FIG. 3E, a further contact metallization 13 has been applied to the rear side of the substrate 11.

In FIGS. 4A to 4E, a further exemplary embodiment of a method for producing an edge emitting semiconductor laser is elucidated on the basis of intermediate steps.

As in the exemplary embodiment described previously, as illustrated in FIG. 4A, firstly a first cladding layer 1A, the waveguide region 4 and a second cladding layer 1B are grown onto a growth substrate 11.

Figure 4A:
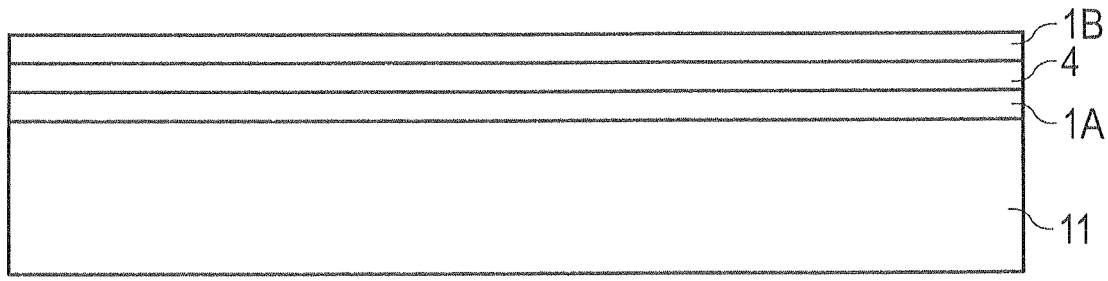
FIGS. 4A, 4B, 4C, 4D and 4E show a schematic illustration of a further exemplary embodiment of a method for producing an edge emitting semiconductor laser on the basis of intermediate steps.
Figure 4B:
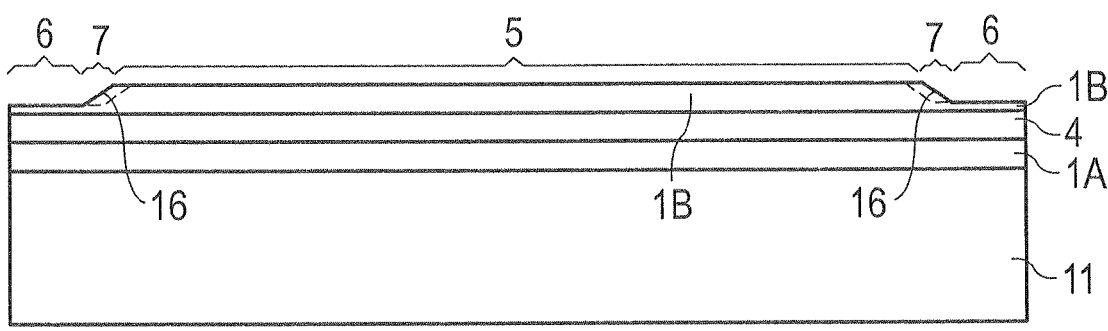

Afterward, as illustrated in FIG. 4B, phase structure regions 6 are produced in the second cladding layer 1B. For this purpose, the second cladding layer 1B is thinned in the regions adjoining the side facets of the semiconductor body. The thinning of the second cladding layer 1B is preferably effected by means of an etching process. In contrast to the exemplary embodiment described previously, however, etching sidewalls 16 running obliquely with respect to the second cladding layer 1B are produced rather than etching sidewalls running perpendicularly to the layer plane of the second cladding layer 1B.

The obliquely running etching sidewalls 16 can be produced, for example, by a photoresist that serves as an etching mask firstly being applied to the phase structure regions 6 and then being liquefied at an increased temperature, with the result that shallow sidewalls are formed on account of the surface tension. The structure of such a photoresist layer having an obliquely falling sidewall is transferred into the second cladding layer 1B in a subsequent etching process, in particular a dry etching process. The steepness of the etching sidewall 16 can be set by way of the selectivity, that is to say the etching rate ratio of the second cladding layer 1B and of the photoresist.

Figure 4C:
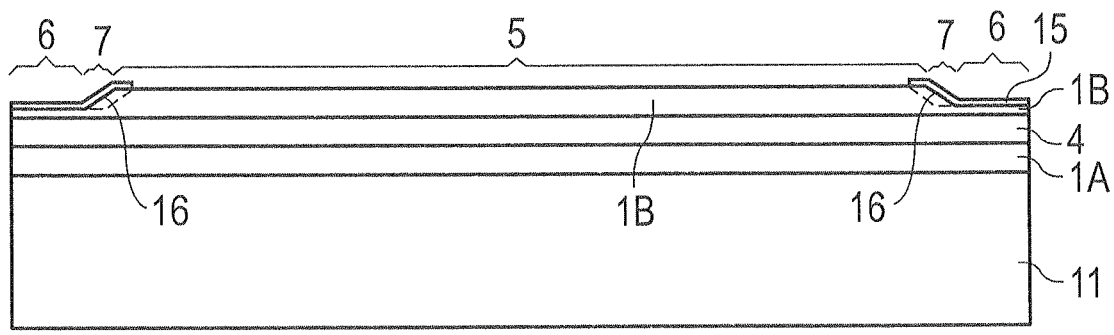

As illustrated in FIG. 4C, a passivation layer 15 is subsequently applied to the thinned partial region of the second cladding layer 1B, the oblique etching sidewall 16 and a partial region of the main region 5 that adjoins the etching sidewall 16.

Figure 4D:
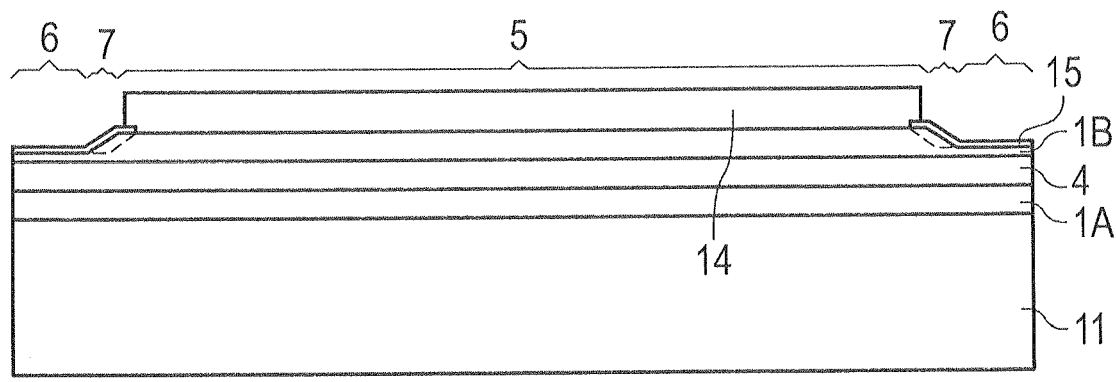

As in the previous exemplary embodiment, it is the case that, as illustrated in FIG. 4D, a contact metallization 14, for example, a titanium-platinum-gold layer sequence, is applied to the second cladding layer 1B.

Figure 4E:
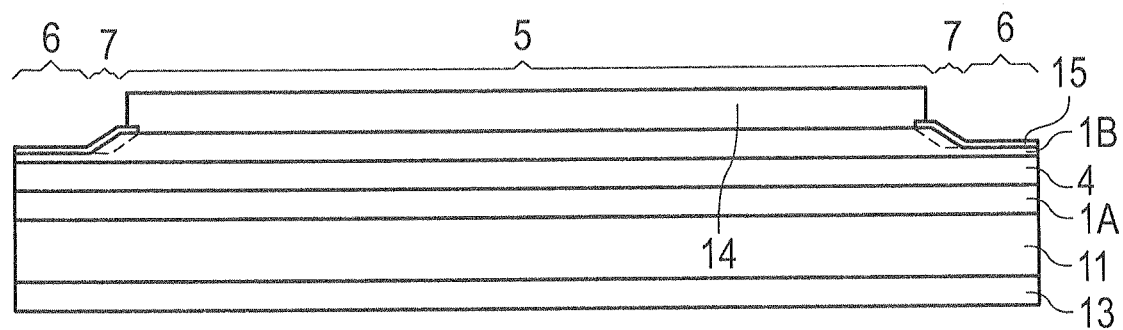

Furthermore, as in the exemplary embodiment described previously, the substrate 11 can be thinned and a further contact metallization 13 can be applied to the rear side of the substrate 11 as is illustrated in FIG. 4E.

FIGS. 5A to 5E illustrate a further exemplary embodiment for producing an edge emitting semiconductor laser on the basis of intermediate steps.

Figure 5A:
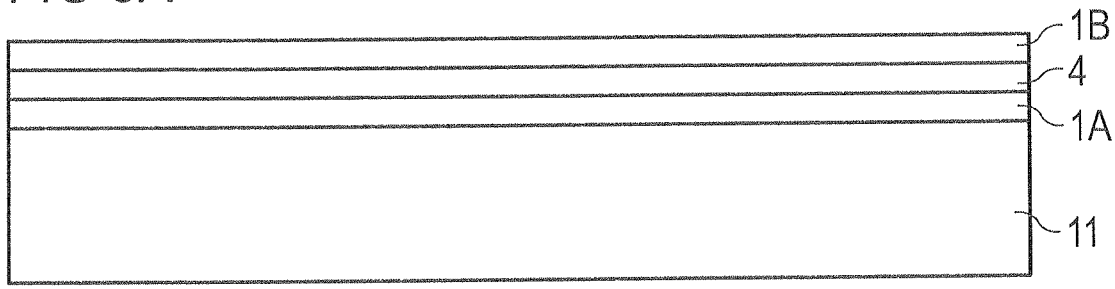
FIGS. 5A, 5B, 5C, 5D and 5E show a schematic illustration of a further exemplary embodiment of a method for producing an edge emitting semiconductor laser on the basis of intermediate steps.

In the intermediate step illustrated in FIG. 5A, as in the exemplary embodiments described previously, a first cladding layer 1A, the waveguide region 4 and a second cladding layer 1B have been applied to a substrate 11.

Figure 5B:
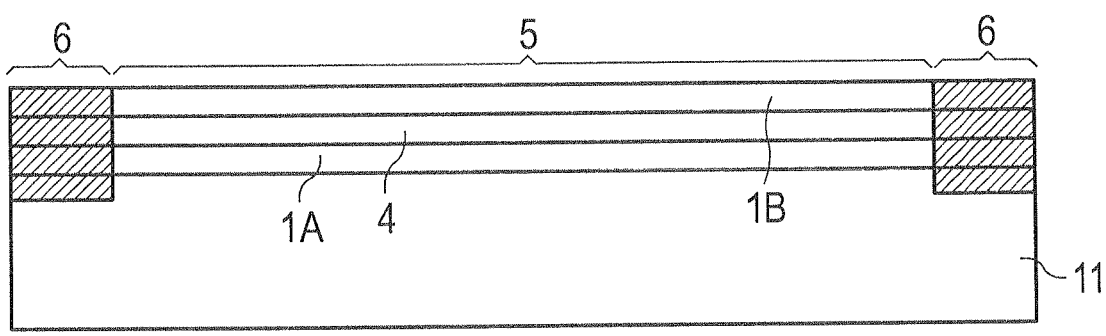

In contrast to the exemplary embodiments described previously, however, the production of the phase structure regions 6 in the semiconductor body is not effected by thinning a partial region of the second cladding layer 1B. Rather, the phase structure regions 6, as is illustrated schematically in FIG. 5B, are produced by, in the phase structure regions 6, at least one additional dopant being implanted or diffused into the semiconductor layer sequence.

As a result of activation of the additional dopant, the additional charge carriers produced as a result in the phase structure regions 6 reduce, by way of the plasma effect, the refractive index of the semiconductor layers and therefore also the effective refractive index in the phase structure regions 6. The phase structure regions 6 are therefore embodied as implantation or diffusion regions. The phase structure regions 6 advantageously adjoin the side facets 9 of the edge emitting semiconductor laser. Furthermore, it is advantageous if the diffusion or implantation regions extend through all layers in which the laser radiation propagates in a lateral direction. By way of example, the diffusion or implantation can be effected through the second cladding layer 1B, the waveguide region 4 and the first cladding layer 1A right into partial regions of the substrate 11, as illustrated in FIG. 5B.

The concentration of the additional dopant in the phase structure regions 6 is preferably set such that the effective refractive index in the phase structure regions 6 differs from the effective refractive index in the main region 5 by not more than $1*10^{-2}$ and preferably by at least $1*10^{-3}$.

Instead of diffusion or implantation regions, the phase structure regions 6 can alternatively also be intermixing regions. In the case of this embodiment, the cladding layers 1A, 1B and/or the active layer and waveguide layers contained in the waveguide region 4 are in each case constructed as a layer sequence composed of a plurality of individual layers. By way of example, the cladding layers, the active layer and/or the waveguide layers can be composed of a plurality of AlGaAs layers or InGaAlP layers having different Al concentrations. As a result of an intermixing of such multilayer structures the band gap changes and therefore so does the effective refractive index in the intermixed region.

Methods for intermixing multilayer structures in order to change the band gap are known per se, for example, from the document DE 10 2004 040 518 A1. By way of example, the intermixing of the multilayer structure can be effected by indiffusion or implantation of Si or Zn, wherein a thermal treatment is preferably carried out afterward. Furthermore, the intermixing can also be effected by irradiation with laser radiation.

Figure 5C:
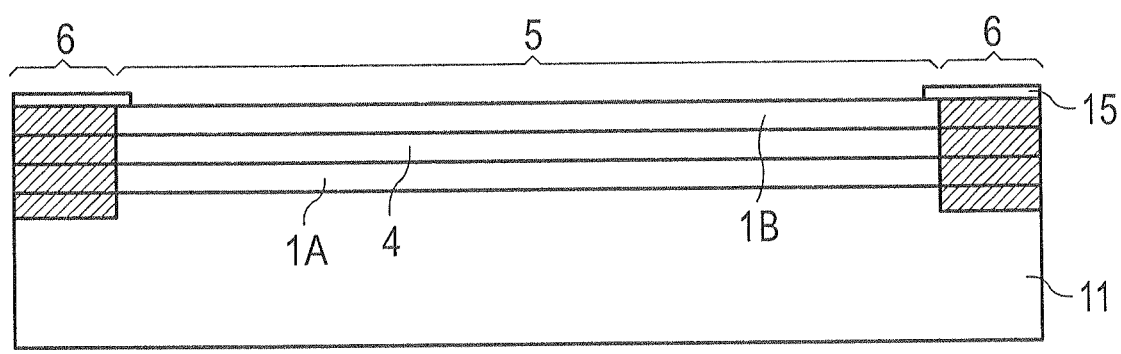
Figure 5D:
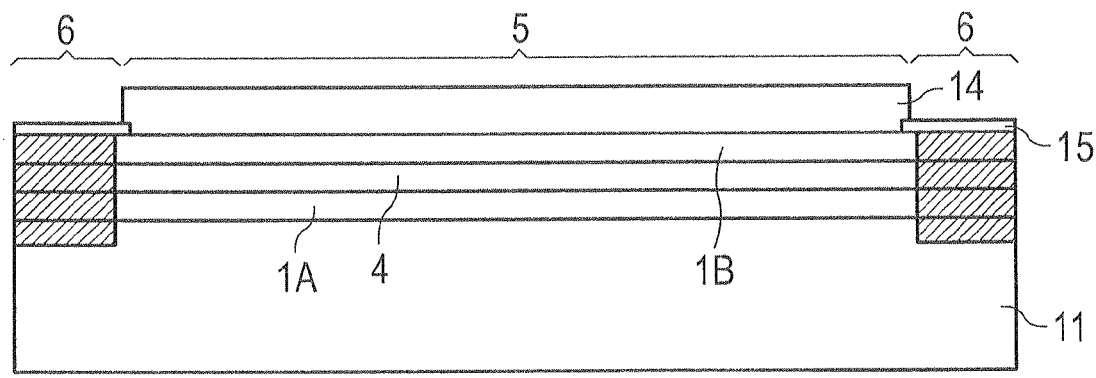

The subsequent method steps correspond to the exemplary embodiments described previously. As illustrated in FIG. 5C, a passivation layer 15 is applied to the phase structure regions 6 and a partial region of the main region 5 adjoining in a lateral direction. The main region 5 of the semiconductor body is subsequently provided with an electrical contact layer 14, as is illustrated in FIG. 5D.

Figure 5E:
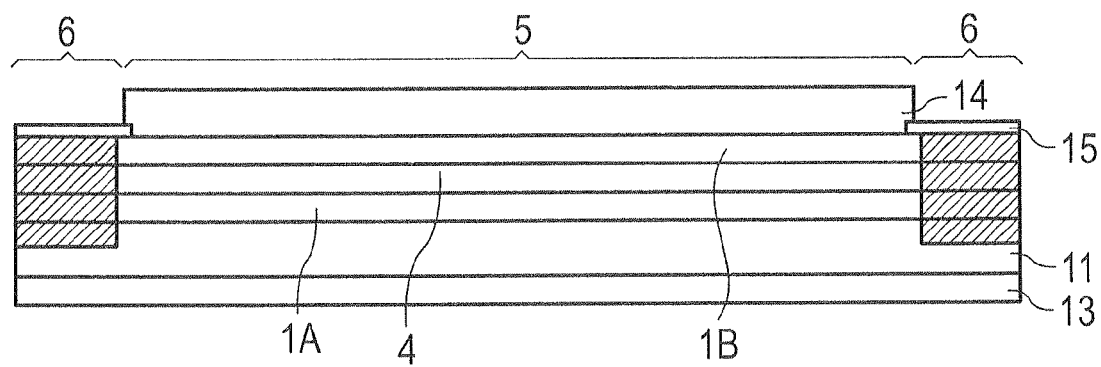

In the further method step illustrated in FIG. 5E, the substrate 11 of the semiconductor body is thinned and a second electrical contact layer 13 is applied to a rear side of the substrate, the rear side being remote from the semiconductor layer sequence.

Figure 6:
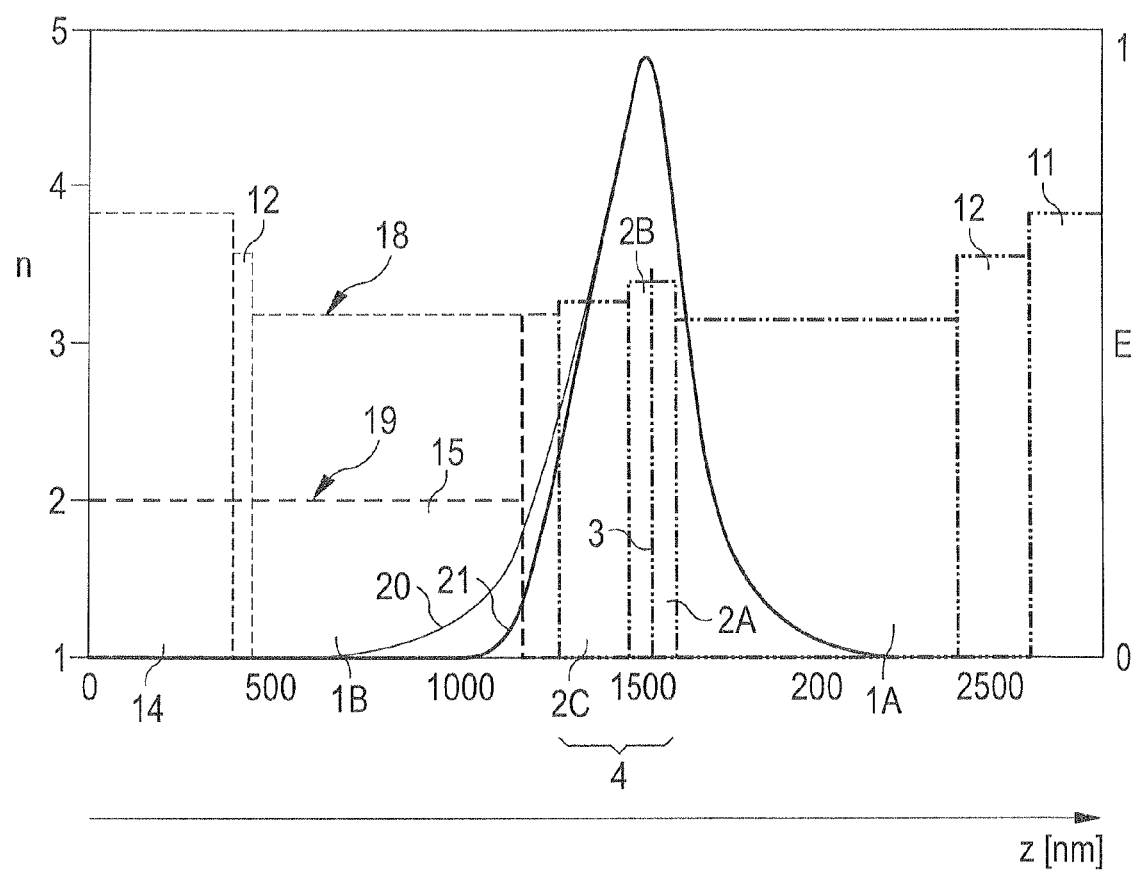
FIG. 6 shows a graphical illustration of the profile of the refractive index n and the electric field strength E in the semiconductor body of a further exemplary embodiment of an edge emitting semiconductor laser.

FIG. 6 illustrates the profile of the refractive index n and of the electric field strength E as a function of a spatial coordinate z, which runs from the surface of the semiconductor body to the substrate, for a further exemplary embodiment of an edge emitting semiconductor laser.

The semiconductor body contains a substrate 11, for example, composed of GaAs, to which an intermediate layer 12 is applied, for example, an AlGaAs layer. That is followed by a first cladding layer 1A, which, in particular, can be an InAlP layer and has a thickness of approximately 800 nm, for example.

The first cladding layer 1A is followed by a waveguide region 4, which has a total thickness of approximately 120 nm, for example. The waveguide region 4 comprises a first waveguide layer 2A and second waveguide layer 2B, which contain $In_{0.5}Ga_{0.3}Al_{0.2}P$, for example, wherein an active layer 3, in particular a quantum film composed of InGaP, is embedded between the waveguide layers 2A, 2B. That is followed by an optional further waveguide layer 2C having a thickness of approximately 200 nm, which comprises $In_{0.5}Ga_{0.15}Al_{0.35}P$, for example, and a second cladding layer 1B, which, like the first cladding layer 1A, can comprise InAlP having a thickness of approximately 800 nm.

The second cladding layer 1B is followed by an intermediate layer 12 having a thickness of approximately 50 nm, for example, composed of InGaP, and thereon a contact layer 14, in particular a GaAs layer.

The thin dashed line 18 represents the profile of the refractive index n in the main region of the semiconductor laser, in which no phase structure region is formed. The boldfaced dashed line 19 represents the profile of the refractive index n in a phase structure region of the semiconductor laser.

As is indicated by the boldfaced dashed line 19, the thickness of the second cladding layer 1B in the phase structure region is thinned to approximately 100 nm and a passivation layer 15, for example, composed of SiON, having a refractive index of approximately 2.0 is applied to the second cladding layer 1B. Below the second cladding layer 1B, the profile of the refractive index in the main region and the phase structure region are identical.

Furthermore, FIG. 6 illustrates the profile of the electric field E in the main region (curve 20) and in the phase structure region (curve 21), in each case in arbitrary units. In the main region, the electric field E propagates right into the second cladding layer 1B. By contrast, in the phase structure region, in which the second cladding layer 1B is thinned to a thickness of approximately 100 nm and a passivation layer 15 adjoins the latter, the electric field penetrates into the second cladding layer 1B and the passivation layer 15 to a lesser extent, which can be attributed, in particular, to the large jump in refractive index between the thinned region of the second waveguide layer 1B and the passivation layer 15.

Overall, the influence of the phase structure region on the distribution of the electric field in a vertical direction of the semiconductor laser is only small, however, as a result of which coupling losses between the phase structure region and the main region are reduced and the efficiency of the semiconductor laser is thus improved.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

What is claimed is:

1. An edge emitting semiconductor laser comprising:
   a semiconductor body, which has a waveguide region;
   wherein the waveguide region has a first waveguide layer, a second waveguide layer and an active layer for generating laser radiation, the active layer being arranged between the first waveguide layer and the second waveguide layer;
   wherein the waveguide region is arranged between a first cladding layer and a second cladding layer, which is disposed downstream of the waveguide region in a growth direction of the semiconductor body;
   wherein the semiconductor body has a main region and at least one phase structure region that is adjacent to the main region in a lateral direction and in which is formed a phase structure for the selection of lateral modes of the laser radiation emitted by the active layer; and
   wherein the phase structure region is formed outside the waveguide region.

2. The edge emitting semiconductor laser as claimed in claim 1, wherein the phase structure region is formed in the second cladding layer.

3. The edge emitting semiconductor laser as claimed in claim 2, wherein the second cladding layer is at least partly removed in the phase structure region.

4. The edge emitting semiconductor laser as claimed in claim 3, further comprising a transition region between the phase structure region and the main region, wherein a thickness of the second cladding layer in the transition region changes step by step or continuously.

5. The edge emitting semiconductor laser as claimed in claim 4, wherein the thickness of the second cladding layer in the transition region rises linearly from the thickness in the phase structure region to the thickness in the main region.

6. The edge emitting semiconductor laser as claimed in claim 1, wherein an effective refractive index $np_{P,eff}$ of the phase structure region deviates by not more than $1*10^{-2}$ from an effective refractive index $n_{H,eff}$ of a main region of the semiconductor body that is adjacent to the phase structure region in a lateral direction.

7. The edge emitting semiconductor laser as claimed in claim 1, wherein an effective refractive index $n_{P,eff}$ of the phase structure region deviates by at least $1*10^{-3}$ from an effective refractive index $n_{H,eff}$ of the main region.

8. The edge emitting semiconductor laser as claimed in claim 1, wherein the phase structure region adjoins a side facet of the semiconductor body.

9. The edge emitting semiconductor laser as claimed in claim 8, further comprising a second phase structure region that adjoins a second side facet of the semiconductor body, the second side facet lying opposite the side facet.

10. The edge emitting semiconductor laser as claimed in claim 1, further comprising a transition region formed between the phase structure region and the main region, wherein an effective refractive index varies in a plurality of steps or continuously within the transition region.

11. The edge emitting semiconductor laser as claimed in claim 10, wherein the effective refractive index varies continuously in the transition region, wherein the gradient of the effective refractive index is not more than 0.01 µm$^{-1}$.

12. The edge emitting semiconductor laser as claimed in claim 1, wherein the second cladding layer is provided with a passivation layer in the phase structure region.

13. The edge emitting semiconductor laser as claimed in claim 12, wherein the passivation layer contains a silicon oxide, a silicon nitride or a silicon oxynitride.

14. An edge emitting semiconductor laser comprising:
a semiconductor body, which has a waveguide region;
wherein the waveguide region has a first waveguide layer, a second waveguide layer and an active layer for generating laser radiation, the active layer being arranged between the first waveguide layer and the second waveguide layer;
wherein the waveguide region is arranged between a first cladding layer and a second cladding layer, which is disposed downstream of the waveguide region in the growth direction of the semiconductor body;
wherein the semiconductor body has a main region and at least one phase structure region that is adjacent to the main region in a lateral direction and in which is formed a phase structure for the selection of lateral modes of the laser radiation emitted by the active layer; and
wherein a dopant is introduced in the phase structure region, as a result of which dopant the effective refractive index $n_{P,eff}$ of the phase structure region is changed in comparison with the main region.

15. The edge emitting semiconductor laser as claimed in claim 14, wherein an effective refractive index $n_{P,eff}$ of the phase structure region deviates by not more than $1*10^{-2}$ from an effective refractive index $n_{H,eff}$ of a main region of the semiconductor body that is adjacent to the phase structure region in a lateral direction.

16. The edge emitting semiconductor laser as claimed in claim 14, wherein an effective refractive index $n_{P,eff}$ of the phase structure region deviates by at least $1*10^{-3}$ from an effective refractive index $n_{H,eff}$ of the main region.

17. The edge emitting semiconductor laser as claimed in claim 14, wherein the phase structure region adjoins a side facet of the semiconductor body.

18. The edge emitting semiconductor laser as claimed in claim 17, further comprising a second phase structure region that adjoins a second side facet of the semiconductor body, the second side facet lying opposite the side facet.

19. The edge emitting semiconductor laser as claimed in claim 14, further comprising a transition region formed between the phase structure region and the main region, wherein an effective refractive index varies in a plurality of steps or continuously within the transition region.

20. The edge emitting semiconductor laser as claimed in claim 19, wherein the effective refractive index varies continuously in the transition region, wherein the gradient of the effective refractive index is not more than 0.01 µm$^{-1}$.

21. The edge emitting semiconductor laser as claimed in claim 14, wherein the second cladding layer is provided with a passivation layer in the phase structure region.

22. The edge emitting semiconductor laser as claimed in claim 21, wherein the passivation layer contains a silicon oxide, a silicon nitride or a silicon oxynitride.

23. An edge emitting semiconductor laser comprising:
a semiconductor body, which has a waveguide region;
wherein the waveguide region has a first waveguide layer, a second waveguide layer and an active layer for generating laser radiation, the active layer being arranged between the first waveguide layer and the second waveguide layer;
wherein the waveguide region is arranged between a first cladding layer and a second cladding layer, which is disposed downstream of the waveguide region in the growth direction of the semiconductor body;
wherein the semiconductor body has a main region and at least one phase structure region that is adjacent to the main region in a lateral direction and in which is formed a phase structure for the selection of lateral modes of the laser radiation emitted by the active layer; and
wherein the semiconductor body has an intermixing structure in the phase structure region.

24. The edge emitting semiconductor laser as claimed in claim 23, wherein an effective refractive index $n_{P,eff}$ of the phase structure region deviates by not more than $1*10^{-2}$ from an effective refractive index $n_{H,eff}$ of a main region of the semiconductor body that is adjacent to the phase structure region in a lateral direction.

25. The edge emitting semiconductor laser as claimed in claim 23, wherein an effective refractive index $n_{P,eff}$ of the phase structure region deviates by at least $1*10^{-3}$ from an effective refractive index $n_{H,eff}$ of the main region.

26. The edge emitting semiconductor laser as claimed in claim 23, wherein the phase structure region adjoins a side facet of the semiconductor body.

27. The edge emitting semiconductor laser as claimed in claim 26, further comprising a second phase structure region that adjoins a second side facet of the semiconductor body, the second side facet lying opposite the side facet.

28. The edge emitting semiconductor laser as claimed in claim 23, further comprising a transition region formed between the phase structure region and the main region, wherein an effective refractive index varies in a plurality of steps or continuously within the transition region.

29. The edge emitting semiconductor laser as claimed in claim 28, wherein the effective refractive index varies continuously in the transition region, wherein the gradient of the effective refractive index is not more than 0.01 $\mu m^{-1}$.

30. The edge emitting semiconductor laser as claimed in claim 23, wherein the second cladding layer is provided with a passivation layer in the phase structure region.

31. The edge emitting semiconductor laser as claimed in claim 30, wherein the passivation layer contains a silicon oxide, a silicon nitride or a silicon oxynitride.

32. The edge emitting semiconductor laser as claimed in claim 3, further comprising a transition region between the phase structure region and the main region, wherein a thickness of the second cladding layer in the transition region changes abruptly.

33. The edge emitting semiconductor laser as claimed in claim 1, further comprising a transition region formed between the phase structure region and the main region, wherein an effective refractive index changes abruptly within the transition region.

34. The edge emitting semiconductor laser as claimed in claim 14, further comprising a transition region formed between the phase structure region and the main region, wherein an effective refractive index changes abruptly within the transition region.

35. The edge emitting semiconductor laser as claimed in claim 23, further comprising a transition region formed between the phase structure region and the main region, wherein an effective refractive index changes abruptly within the transition region.

* * * * *